United States Patent
De La Cruz (10) Patent No.: US 9,525,832 B1
(45) Date of Patent: Dec. 20, 2016

(54) IMAGE SENSOR DEVICE WITH AN ELECTROMAGNETIC COMPATIBILITY SHIELD (EMC) AND ASSOCIATED METHODS

(71) Applicant: STMICROELECTRONICS PTE LTD, Singapore (SG)

(72) Inventor: Dave Alexis De La Cruz, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 42 days.

(21) Appl. No.: 14/740,565

(22) Filed: Jun. 16, 2015

(51) Int. Cl.
H04N 5/225 (2006.01)
H04N 5/369 (2011.01)
G01D 11/24 (2006.01)
H01L 31/0232 (2014.01)

(52) U.S. Cl.
CPC ............ *H04N 5/369* (2013.01); *G01D 11/245* (2013.01); *H04N 5/2252* (2013.01); *H04N 5/2253* (2013.01); *H04N 5/2257* (2013.01); *H01L 31/02325* (2013.01)

(58) Field of Classification Search
CPC ................ H04N 5/2253; H04N 5/2254; H01L 31/02325; G01D 11/245
USPC .................. 348/374; 250/239; 257/433–434
See application file for complete search history.

(56) References Cited

U.S. PATENT DOCUMENTS

| | | | |
|---|---|---|---|
| 8,582,022 B2 | 11/2013 | Rudmann | |
| 8,934,052 B2 * | 1/2015 | Luan | H04N 5/2251 348/374 |
| 8,970,781 B2 * | 3/2015 | Ryou | G02B 7/08 348/208.7 |
| 9,143,664 B2 * | 9/2015 | Phoon | G02B 7/04 |
| 9,154,674 B2 * | 10/2015 | Lee | H04N 5/2252 |
| 9,179,053 B2 * | 11/2015 | Takeshita | H04N 5/2253 |
| 9,197,802 B2 * | 11/2015 | Kwon | H04N 5/2254 |
| 9,413,932 B2 * | 8/2016 | Li | H04N 5/2253 |
| 9,413,933 B2 * | 8/2016 | Yu | H04N 5/2252 |
| 2009/0115891 A1 | 5/2009 | Ryu et al. | |

* cited by examiner

*Primary Examiner* — Ngoc-Yen Vu
(74) *Attorney, Agent, or Firm* — Allen, Dyer, Doppelt, Milbrath & Gilchrist, P.A.

(57) ABSTRACT

An image sensor device includes a base having a rectangular shape and comprising first contacts and a reference voltage contact extending along a first side thereof, a housing carried by the base, and an image sensor integrated circuit (IC) carried by the base within the housing and having an image sensing surface. A focus cell is within the housing, aligned with the image sensing surface, and includes second contacts. An electromagnetic compatibility (EMC) shield is carried by the housing and includes a top panel having an opening therein aligned with the focus cell, and side panels extending downwardly from the top panel. Conductive leads extend between one of the first contacts and a corresponding one of the second contacts. A reference conductive lead extends between the reference voltage contact and the EMC shield.

27 Claims, 8 Drawing Sheets

IMAGE SENSOR DEVICE WITH AN ELECTROMAGNETIC COMPATIBILITY SHIELD (EMC) AND ASSOCIATED METHODS

FIELD OF THE INVENTION

The present invention relates to the field of electronic devices, and more particularly, to image sensors and related methods.

BACKGROUND OF THE INVENTION

Small sized integrated camera devices, like those for mobile phones, are susceptible to interference due to electromagnetic wave interactions.

Electromagnetic compatibility (EMC) of electronic components is becoming increasingly important. Electromagnetic compatibility (EMC) refers to the ability of an electrical device to work satisfactorily in its electromagnetic environment without adversely either influencing the surrounding devices, or being influenced by them. Electromagnetic shielding limits the flow of electromagnetic fields between two locations, by separating them with a barrier made of conductive material.

Typically, a conductive barrier is applied to an enclosure to function as a EMC shield. Shielding can reduce the coupling of electromagnetic fields. The amount of reduction depends upon the material used, its thickness, and the frequency of the fields of interest.

One approach for shielding an image sensor is disclosed in U.S. published patent application number 2009/0115891. This reference discloses a camera module that includes a lens unit comprising at least one lens, an image sensor package including an image sensor chip having an image area where an image is formed in response to light passing through the lens unit, and a housing surrounding the lens unit and the image sensor package. The housing is formed of a conductive material and is electrically connected to the image sensor package via a conductive paste.

Another approach for shielding an image sensor is to use an EMC shield carried by the housing, wherein the EMC shield is coupled to a ground contact on a substrate that carries the housing. In particular, the substrate has a rectangular shape and includes first contacts on a first side and a ground contact on a second side. In this arrangement, a process step is required to connect conductive leads from a focus cell carried by the housing to the first contacts on the first side of the substrate, and a second process step is required to connect a ground conductive lead from the EMC shield to the ground contact on the second side of the substrate. During manufacture, orientation of the image sensor needs to be changed to accommodate the two different process steps.

SUMMARY OF THE INVENTION

An image sensor device may comprise a substrate having a rectangular shape and comprising a plurality of first contacts and a reference voltage contact extending along a first side thereof. A housing may be carried by the substrate. An image sensor integrated circuit (IC) may be carried by the substrate within the housing and have an image sensing surface. A focus cell may be within the housing, aligned with the image sensing surface, and comprise a plurality of second contacts. An electromagnetic compatibility (EMC) shield may be carried by the housing and comprise a top panel having an opening therein aligned with the focus cell, and at least two side panels extending downwardly from the top panel. The image sensor may further include a plurality of conductive leads, each extending between one of the first contacts and a corresponding one of the second contacts, and a reference conductive lead extending between the reference voltage contact and the EMC shield.

The EMC shield shields the image sensor device while having the reference voltage contact and the first contacts on the same first side of the substrate. During manufacture of the image sensor device, orientation of the image sensor device advantageously remains the same when coupling the conductive leads to the first contacts on the first side of the substrate, and when coupling the reference conductive lead to the reference voltage contact on the same first side of the substrate. This allows for a time and cost savings during manufacturing, particularly when manufacturing the image sensor device in mass quantities.

The reference conductive lead may be configured to contact one of the plurality of side panels of the EMC shield. More particularly, the housing has first and second side walls, with the first side wall aligned with the first side of the substrate, and with the second side wall adjacent the first side wall and having a opening extending therethrough. The reference conductive lead is exposed within the opening so as to make contact with the side panel of the EMC shield.

Alternatively, the reference conductive lead may be configured to contact the top panel of the EMC shield. The top panel may comprise a tab configured to make contact with the the reference conductive lead. More particularly, an upper surface of the housing may include an opening aligned with a portion of the reference conductive lead. Conductive glue may be placed within the opening so as to provide an electrical connection between the reference conductive lead and the tab of the top panel of the EMC shield.

The housing may has first and second side walls, with the first side wall aligned with the first side of the substrate, and with the second side wall adjacent the first side wall and having a housing recess. One of the plurality of side panels of the EMC shield may have a tab that is received by the housing recess so as to provide a locking arrangement for retaining the EMC shield in place.

The EMC shield may comprise an aluminum film. An anti-reflective coating may be on an outer surface of the EMC shield. An adhesive layer may be on an inner surface of the EMC shield.

A method for making an image sensor device as described above may comprise providing a substrate having a rectangular shape and comprising a plurality of first contacts and a reference voltage contact extending along a first side thereof. A housing may be positioned to be carried by the substrate. An image sensor integrated circuit (IC) may be positioned to be carried by the substrate within the housing, with the image sensor IC having an image sensing surface. A focus cell may be positioned within the housing, aligned with the image sensing surface. The focus cell may include a plurality of second contacts.

An EMC shield may be positioned to be carried by the housing. The EMC shield may include a top panel having an opening therein aligned with the focus cell, and a plurality of side panels extending downwardly from the top panel. Conductive leads may be positioned, with each conductive lead extending between one of the first contacts and a corresponding one of the second contacts. A reference conductive lead may be positioned to extend between the reference voltage contact and the EMC shield.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1:
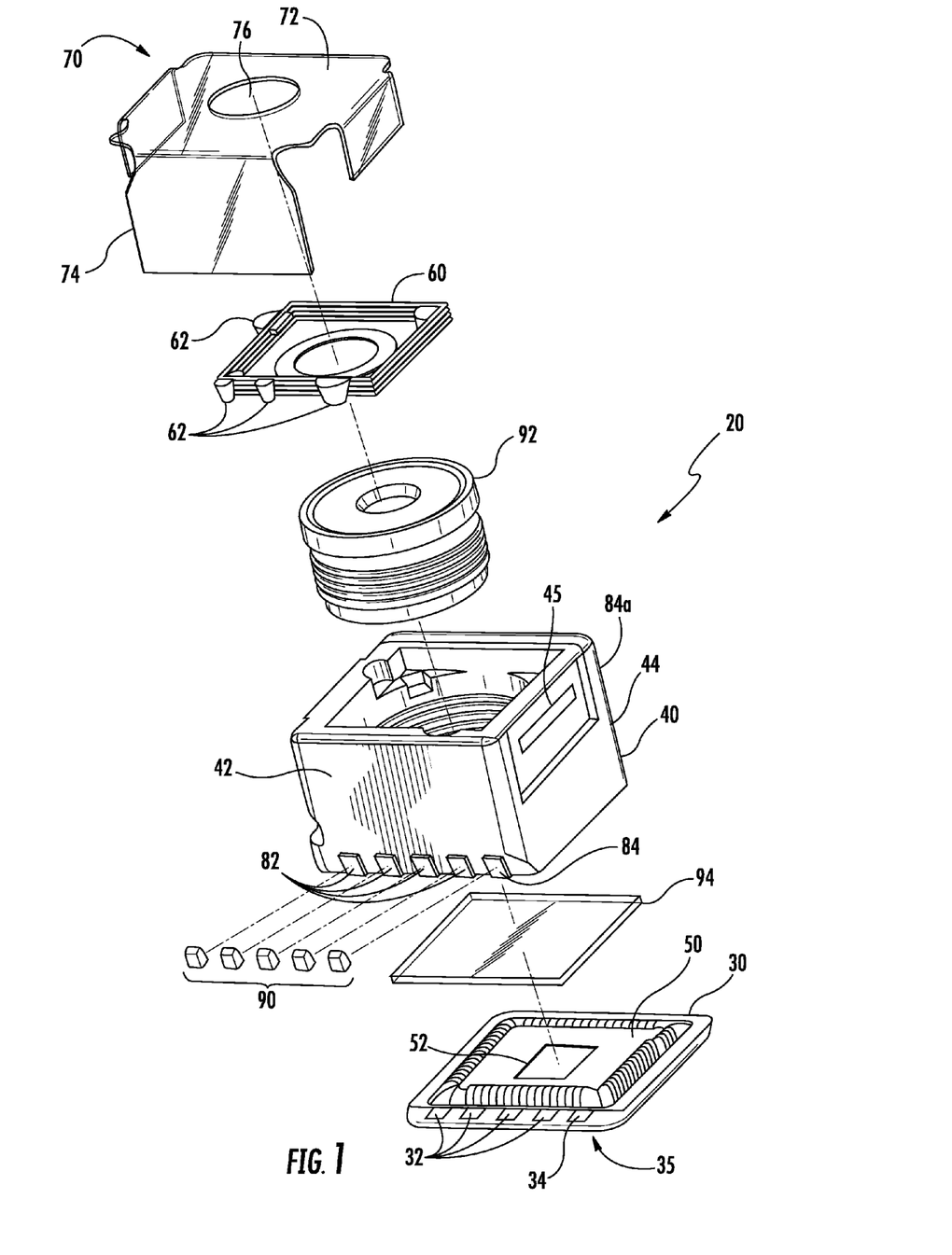
FIG. 1 is an exploded view of an image sensor with an EMC shield in accordance with the present invention.

Referring initially to the exploded view in FIG. 1, the illustrated image sensor device 20 comprises a substrate 30 having a rectangular shape, with the substrate comprising a plurality of first contacts 32 and a reference voltage contact 34 extending along a first side 35 thereof. A housing 40 is carried by the substrate 30. An image sensor integrated circuit (IC) 50 is carried by the substrate 30 within the housing 40 and has an image sensing surface 52. A focus cell 60 is within the housing 40, aligned with the image sensing surface 52, and comprises a plurality of second contacts 62.

An electromagnetic compatibility (EMC) shield 70 is carried by the housing 40 and comprises a top panel 72, and a plurality of side panels 74 extending downwardly from the top panel. The top panel 72 has an opening 76 therein aligned with the focus cell 60.

Figure 2:
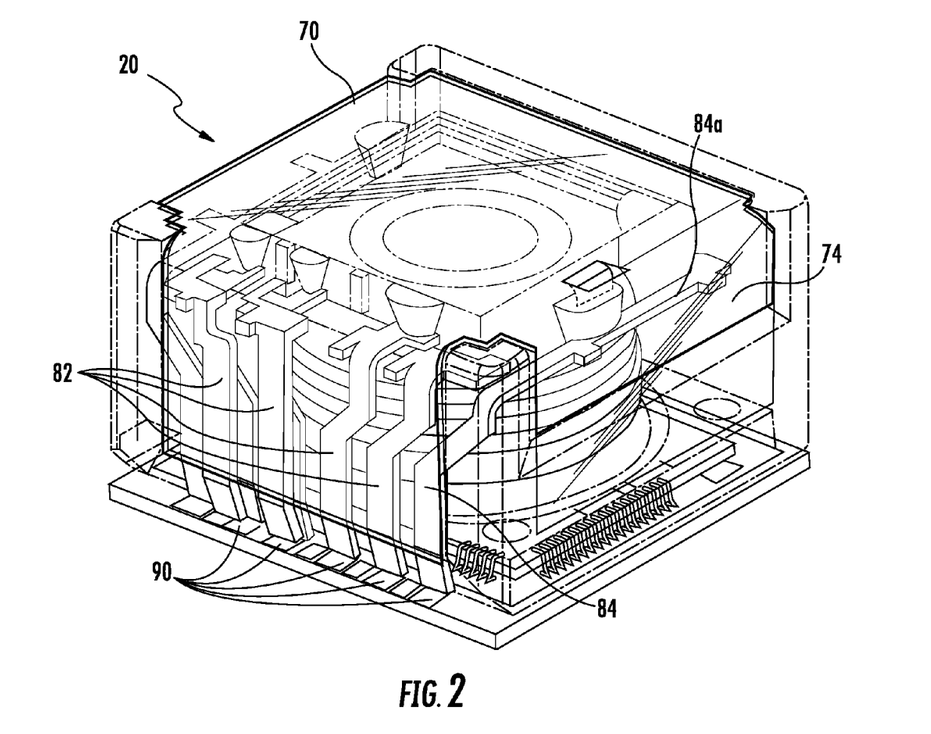
FIG. 2 is a perspective layered view of the image sensor device illustrated in FIG. 1 assembled.

A perspective layered view of the image sensor device 20 assembled is provided in FIG. 2. A plurality of conductive leads 82 extend between one of the first contacts 32 and a corresponding one of the second contacts 62. A reference conductive lead 84 extends between the reference voltage contact 34 and the EMC shield 70. The reference conductive lead 84 provides a ground, for example, to the EMC shield 70.

The EMC shield 70 may also be referred to as a conductive baffle, and shields the image sensor device 20 while having the reference voltage contact 34 and the first contacts 32 on the same first side 35 of the substrate 30. During manufacture of the image sensor device 20, orientation of the image sensor device 20 advantageously remains the same when coupling the conductive leads 82 to the first contacts 32 on the first side 35 of the substrate 30, and when coupling the reference conductive lead 84 to the reference voltage contact 34 on the same first side of the substrate 30. Solder or conductive glue 90 is used to provide the coupling. With the reference voltage contact 34 and the first contacts 32 on the same first side of the substrate 30, there is a time and cost savings during manufacturing, particularly when manufacturing the image sensor device 20 in mass quantities.

The image sensor device 20 further includes a lens barrel 92 positioned within the housing 40 between the focus cell 60 and the image sensing surface 52. An infrared filter 94 is positioned between the barrel 92 and the image sensing surface 52. The focus cell 60 may be a liquid crystal focus cell, for example. The liquid crystal focus cell may be configured as a solid state autofocus lens cell.

The EMC shield 70 may comprise an aluminum film, for example. A thickness of the EMC shield 70 may be within a range of 40 to 60 microns, such as 50 microns, for example. A cross-sectional side view of the EMC shield 70 is provided in FIG. 3.

Figure 3:
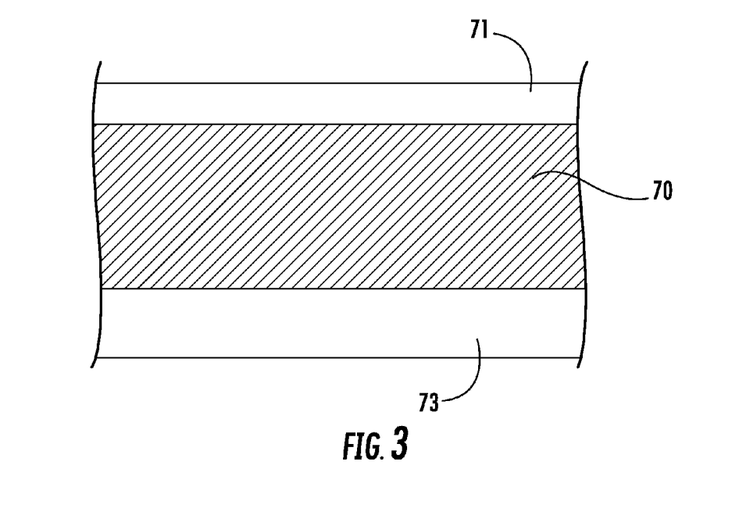
FIG. 3 is a cross-sectional view of the EMC shield with an anti-reflective coating and an adhesive layer thereon in accordance with the present invention.

An anti-reflective coating 71 may be on an outer surface of the EMC shield 70. The anti-reflective coating 71 is typically a dark color, such as black. A thickness of the anti-reflective coating 71 may be within a range of 5 to 15 microns, such as 10 microns, for example.

An adhesive layer 73 may be on an inner surface of the EMC shield. The adhesive layer may be any well known adhesive agent. The adhesive layer 73 may include conductive and non-conductive portions. The conductive portion is on an area of the EMC shield 70 contacting the reference conductive lead 84, and may be an anisotropic conductive film (ACF). The non-conductive portions are on areas of the EMC shield 70 that are not contacting the reference conductive lead.

Referring back to FIGS. 1 and 2, the reference conductive lead 84 is configured to contact one of the side panels 74 of the EMC shield 70. More particularly, the housing 40 has first and second side walls, with the first side wall 42 aligned with the first side 35 of the substrate 30, and with the second side wall 44 adjacent the first side wall and having a opening 45 extending therethrough. A portion 84a of the reference conductive lead 84 is exposed and extends within the opening 45 so as to make contact with one of the side panels 74 of the EMC shield 70.

Figure 4:
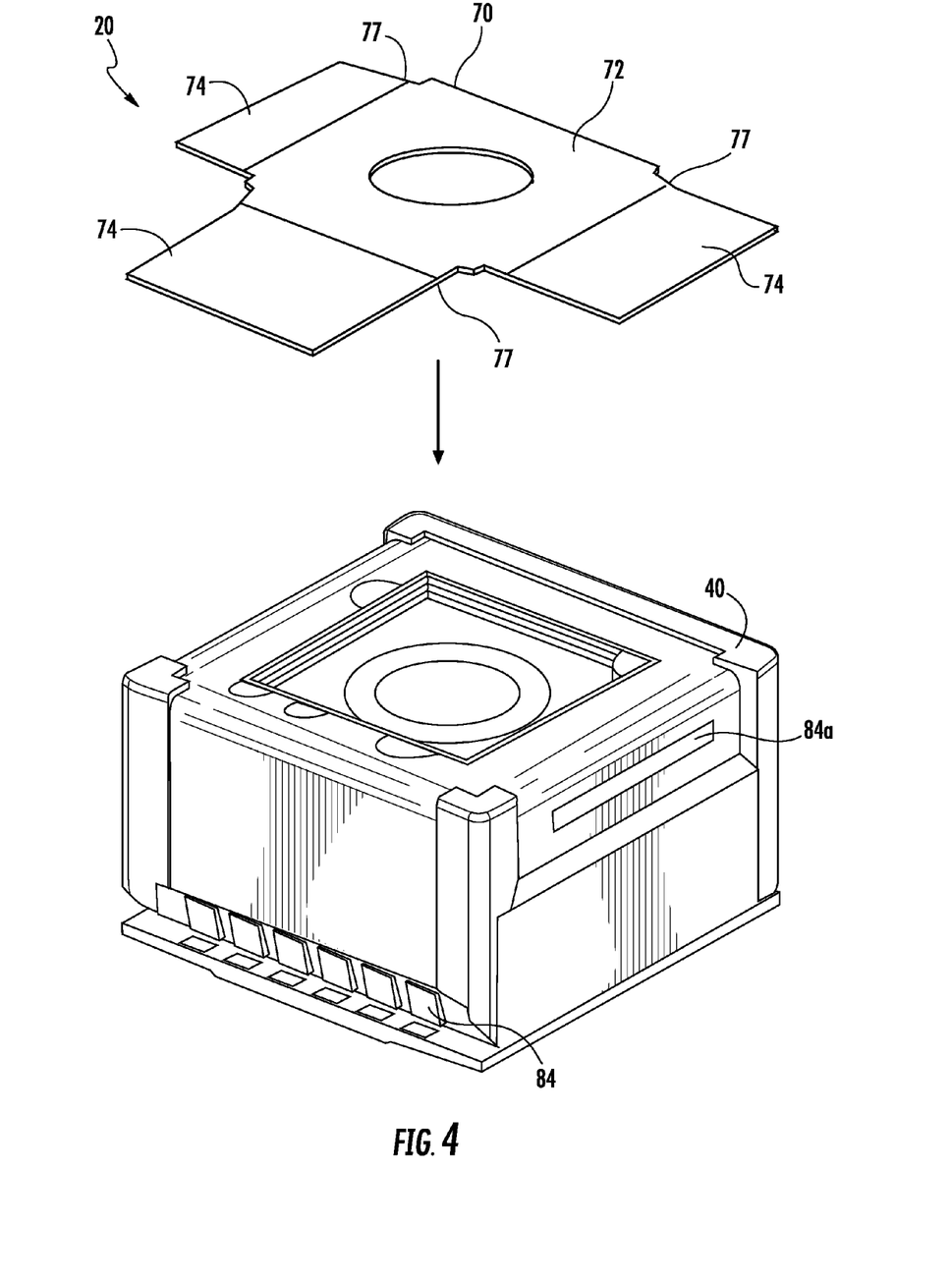
FIG. 4 is a perspective view of the EMC shield being positioned onto the housing as illustrated in FIG. 1.
Figure 5:
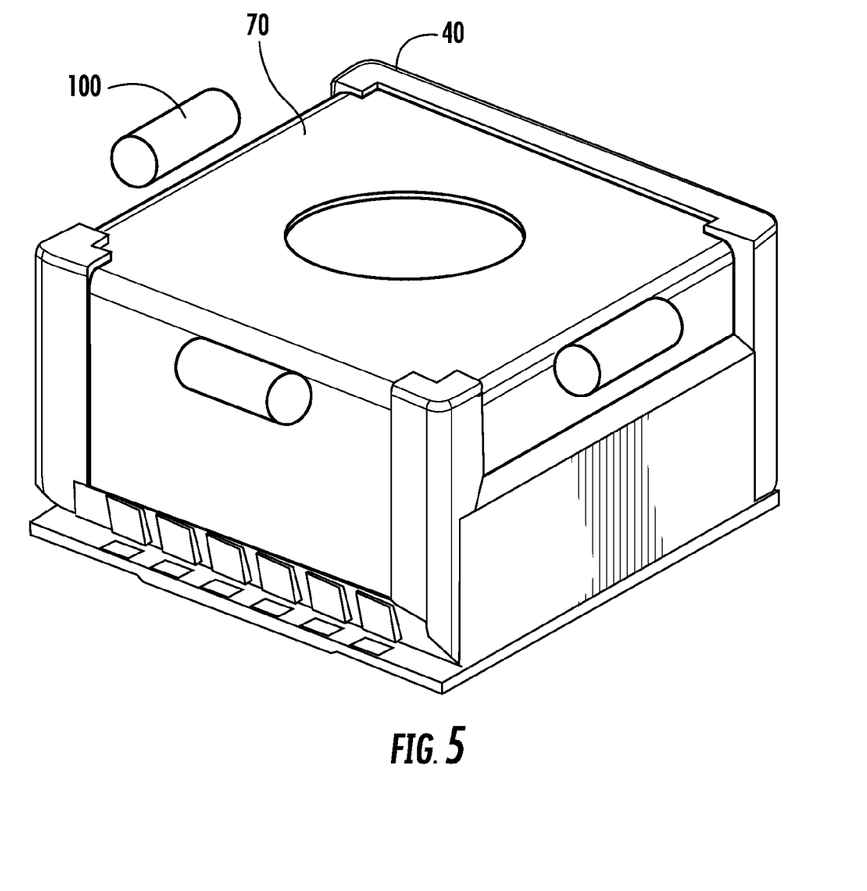
FIG. 5 is a perspective view of the EMC shield being folded along the side panels to the housing as illustrated in FIG. 1.

The EMC shield 70 is initially formed in a relatively flat or coplanar configuration, as illustrated in FIG. 4. The EMC shield 70 includes fold lines 77 between the top panel 72 and the side panels 74. The EMC shield 70 is pick and placed onto an upper surface of the housing 40. The side panels 74 of the EMC shield 70 are folded along the sidewalls of the housing 40 using rollers or clamps 100, as illustrated in FIG. 5. The adhesive layer 73 on the inner surface of the EMC shield 70 holds the EMC shield in place.

The illustrated EMC shield 70 has three side panels 74. In other embodiments, the number of side panels 74 may vary from one to four, with four side panels covering all four sides of the housing 40.

Figure 6:
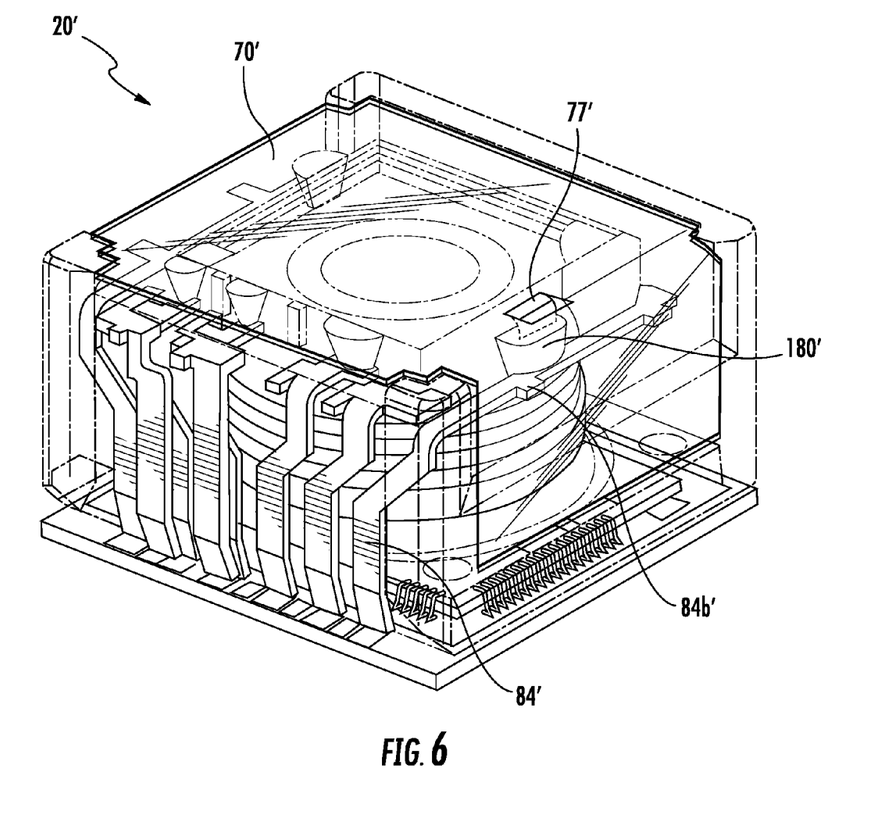
FIG. 6 is a perspective layered view of another embodiment of the image sensor device illustrated in FIG. 1 assembled.
Figure 7:
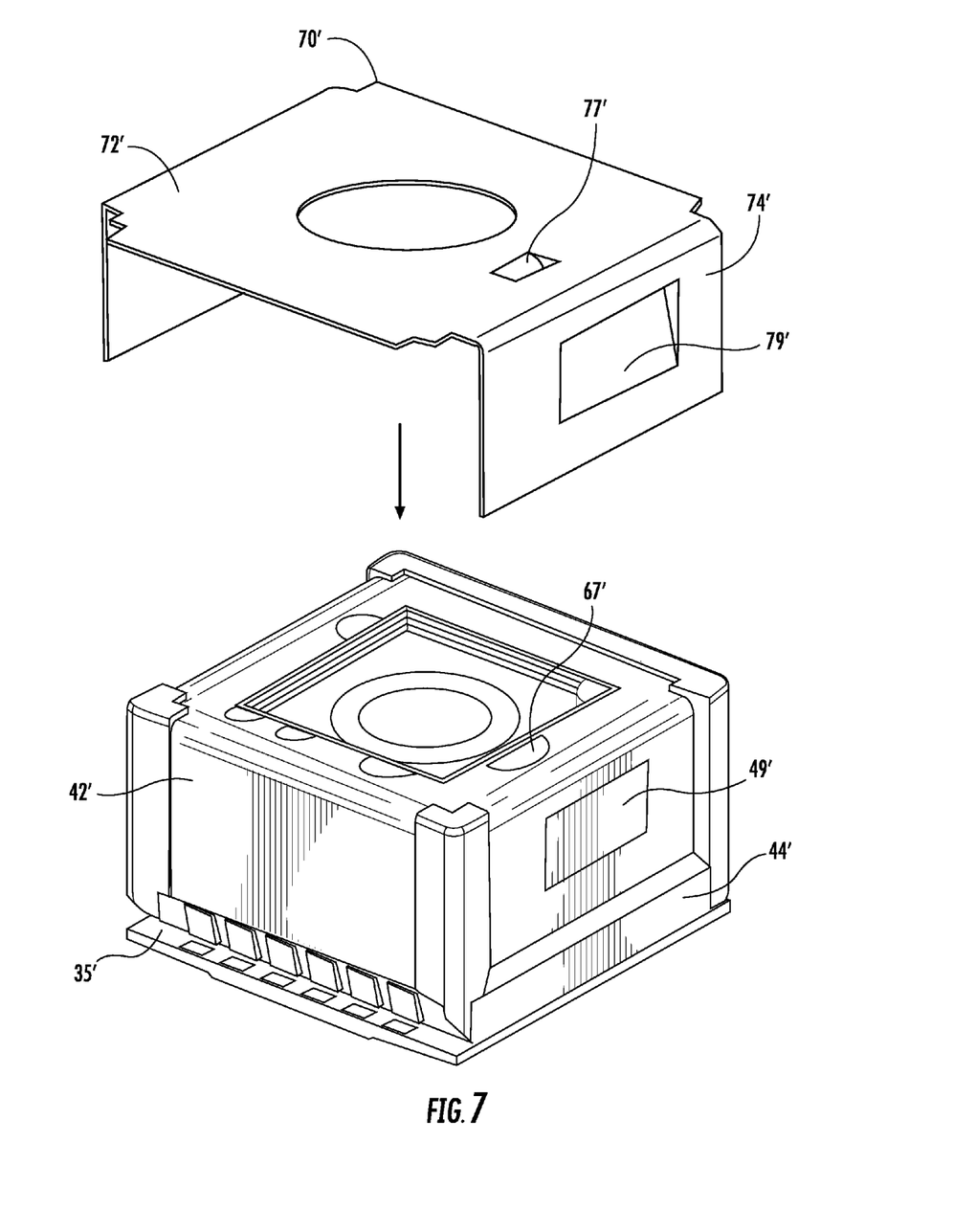
FIG. 7 is a perspective view of the EMC shield being positioned onto the housing as illustrated in FIG. 6.
Figure 8:
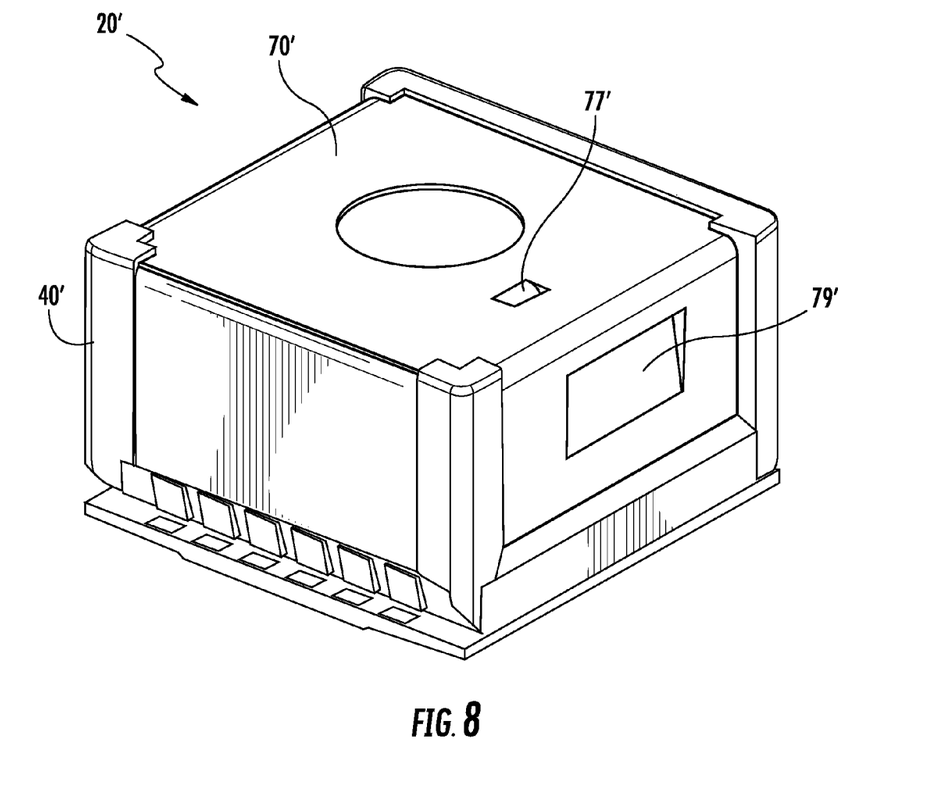
FIG. 8 is a perspective view of the image sensor device assembled with the EMC shield illustrated in FIG. 6.

Another embodiment of the image sensor device 20' will now be discussed in reference to FIGS. 6-8. In this embodiment, the reference conductive lead 84' is configured to contact the top panel 72' of the EMC shield 70', as illustrated in FIG. 7 providing a perspective layered view of the image sensor device 20'. The EMC shield 70' may also be referred to as a conductive baffle, and shields the image sensor device 20'. while having the reference voltage contact 34' and the first contacts 32' on the same first side 35' of the substrate 30'.

The top panel 72' of the EMC shield 70' includes a tab 77' configured to make contact with the reference conductive lead 84'. More particularly, the top of the housing 40' includes an opening 67' aligned with a portion 84b' of the reference conductive lead 84'. Conductive glue 180' is placed within the opening 67' before the EMC shield 70' is positioned onto the housing 40'. The conductive glue 180' provides an electrical connection between the reference conductive lead 84' and the tab 77' in the top panel 72' of the EMC shield 70'.

In addition, the housing 40' has first and second side walls, with the first side wall 42' aligned with the first side 35' of the substrate 30', and with the second side wall 44' adjacent the first side wall and having a housing recess 49'. One of the side panels 74' of the EMC shield 70' has a tab 79' that is received by the housing recess 49' so as to provide a locking arrangement for retaining the EMC shield 70' in place. An assembled view of the image sensor device 20' with the EMC shield 70' is provided in FIG. 8.

The illustrated EMC shield 70' has two side panels 74'. In other embodiments, the number of side panels 74' may vary from one to four, with four side panels covering all four sides of the housing 40'.

Figure 9:
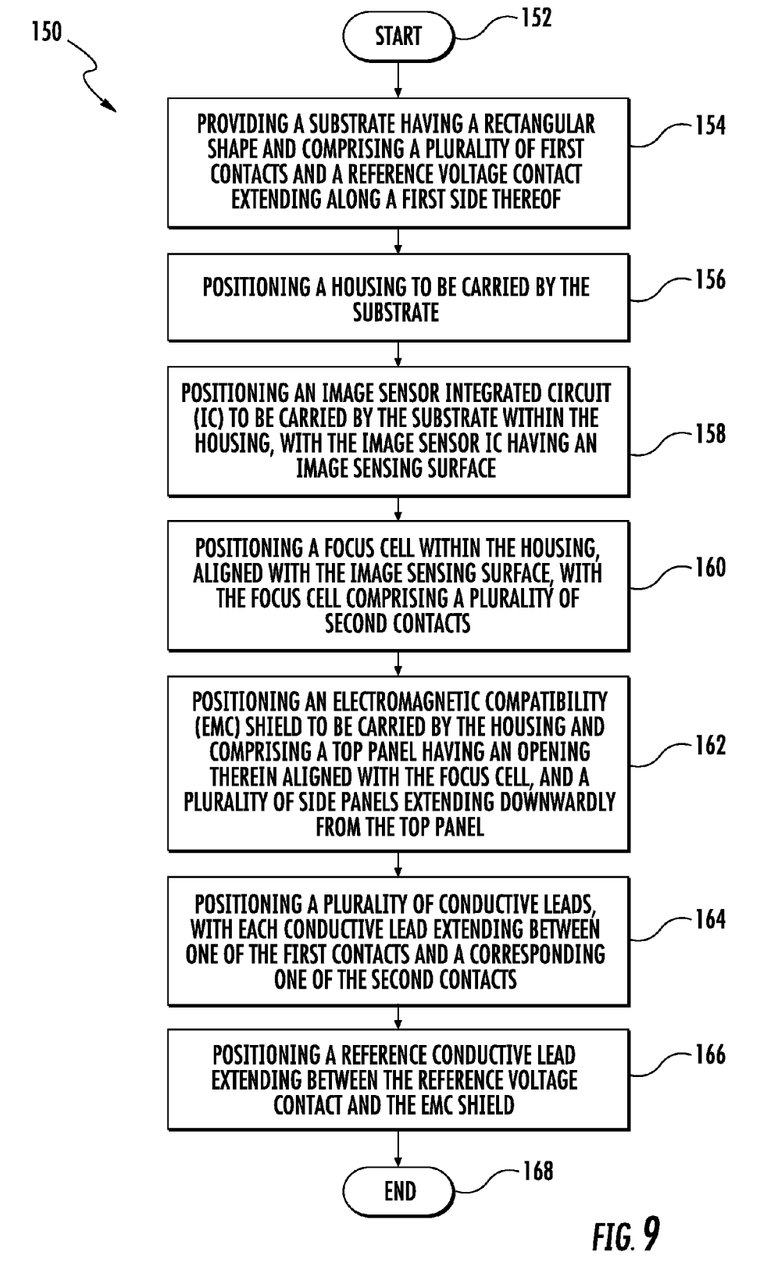
FIG. 9 is a flowchart illustrating a method for making the image sensor device illustrated in FIG. 1.

Referring now to the flowchart 150 illustrated in FIG. 9, a method for making an image sensor device 20 will be discussed. From the start (Block 152), the method comprises providing at Block 154 a substrate 30 having a rectangular shape and comprising a plurality of first contacts 32 and a reference voltage contact 34 extending along a first side 35 thereof. A housing 40 is positioned at Block 156 to be carried by the substrate 30. An image sensor integrated circuit (IC) 50 is positioned at Block 158 to be carried by the substrate 30 within the housing 40, with the image sensor IC having an image sensing surface 52. A focus cell 60 is positioned within the housing 40 at Block 160, aligned with the image sensing surface 52. The focus cell 60 includes a plurality of second contacts 62.

An EMC shield 70 is positioned at Block 162 to be carried by the housing 40. The EMC shield 70 includes a top panel 72 having an opening 76 therein aligned with the focus cell 60, and a plurality of side panels 74 extending downwardly from the top panel. Conductive leads 82 are positioned at Block 164, with each conductive lead extending between one of the first contacts 32 and a corresponding one of the second contacts 62. A reference conductive lead 84 is positioned at Block 166 to extend between the reference voltage contact 34 and the EMC shield 70. The method ends at Block 168.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An image sensor device comprising:
   a substrate having a rectangular shape and comprising a plurality of first contacts and a reference voltage contact extending along a first side thereof;
   a housing carried by said substrate;
   an image sensor integrated circuit (IC) carried by said substrate within said housing and having an image sensing surface;
   a focus cell within said housing, aligned with said image sensing surface, and comprising a plurality of second contacts;
   an electromagnetic compatibility (EMC) shield carried by said housing and comprising
   a top panel having an opening therein aligned with said focus cell, and
   a plurality of side panels extending downwardly from said top panel;
   a plurality of conductive leads, each extending between one of said first contacts and a corresponding one of said second contacts; and
   a reference conductive lead extending between said reference voltage contact and said EMC shield.

2. The image sensor device according to claim 1 wherein said reference conductive lead is configured to contact one of said plurality of side panels of said EMC shield.

3. The image sensor device according to claim 1 wherein said housing has first and second side walls, with the first side wall aligned with the first side of said substrate, with the second side wall adjacent the first side wall and having an opening extending therethrough; and wherein said reference conductive lead is exposed within the opening so as to make contact with one of said plurality of side panels of said EMC shield.

4. The image sensor device according to claim 1 wherein said reference conductive lead is configured to contact said top panel of said EMC shield.

5. The image sensor device according to claim 4 wherein said top panel of said EMC shield comprises a tab configured to make contact with said reference conductive lead.

6. The image sensor device according to claim 5 wherein an upper surface of said housing includes an opening aligned with a portion of said reference conductive lead; and further comprising conductive glue within the opening so as to provide an electrical connection between said reference conductive lead and the tab of said top panel of said EMC shield.

7. The image sensor device according to claim 1 wherein said housing has first and second side walls, with the first side wall aligned with the first side of said substrate, with the second side wall adjacent the first side wall and having a housing recess; and wherein one of said plurality of side panels of said EMC shield has a tab that is received by the housing recess so as to provide a locking arrangement for retaining said EMC shield in place.

8. The image sensor device according to claim 1 wherein said EMC shield comprises an aluminum film.

9. The image sensor device according to claim 1 further comprising an anti-reflective coating on an outer surface of said EMC shield.

10. The image sensor device according to claim 1 further comprising an adhesive layer on an inner surface of said EMC shield.

11. An image sensor device comprising:
    a substrate having a rectangular shape and comprising a plurality of first contacts and a reference voltage contact extending along a first side thereof;
    a housing carried by said substrate and having first and second side walls, with the first side wall aligned with the first side of said substrate, and with the second side wall adjacent the first side wall and having an opening extending therethrough;

an image sensor integrated circuit (IC) carried by said substrate within said housing and having an image sensing surface;

a focus cell within said housing, aligned with said image sensing surface, and comprising a plurality of second contacts;

an electromagnetic compatibility (EMC) shield carried by said housing and comprising
- a top panel having an opening therein aligned with said focus cell, and
- a plurality of side panels extending downwardly from said top panel;

a plurality of conductive leads, each extending between one of said first contacts and a corresponding one of said second contacts; and a reference conductive lead extending between said reference voltage contact and one of said plurality of side panels of said EMC shield, with said reference conductive lead being exposed within the opening in the second side wall of said housing to make contact with said side panel.

12. The image sensor device according to claim 11 wherein said EMC shield comprises an aluminum film.

13. The image sensor device according to claim 11 further comprising an anti-reflective coating on an outer surface of said EMC shield.

14. The image sensor device according to claim 11 further comprising an adhesive layer on an inner surface of said EMC shield.

15. An image sensor device comprising:
a substrate having a rectangular shape and comprising a plurality of first contacts and a reference voltage contact extending along a first side thereof;
a housing carried by said substrate;
an image sensor integrated circuit (IC) carried by said substrate within said housing and having an image sensing surface;
a focus cell within said housing, aligned with said image sensing surface, and comprising a plurality of second contacts;
an electromagnetic compatibility (EMC) shield carried by said housing and comprising
- a top panel comprising a tab and having an opening therein aligned with said focus cell, and
- a plurality of side panels extending downwardly from said top panel;
a plurality of conductive leads, each extending between one of said first contacts and a corresponding one of said second contacts;
a reference conductive lead extending between said reference voltage contact and said EMC shield;
an upper surface of said housing including an opening aligned with a portion of said reference conductive lead; and
conductive glue within the opening so as to provide an electrical connection between said reference conductive lead and the tab of said top panel of said EMC shield.

16. The image sensor device according to claim 15 wherein said housing has first and second side walls, with the first side wall aligned with the first side of said substrate, with the second side wall adjacent the first side wall and having a housing recess; and wherein one of said plurality of side panels of said EMC shield has a tab that is received by the housing recess so as to provide a locking arrangement for retaining said EMC shield in place.

17. The image sensor device according to claim 15 wherein said EMC shield comprises an aluminum film.

18. The image sensor device according to claim 15 further comprising an anti-reflective coating on an outer surface of said EMC shield.

19. A method for making an image sensor device comprising:
providing a substrate having a rectangular shape and comprising a plurality of first contacts and a reference voltage contact extending along a first side thereof;
positioning a housing to be carried by the substrate;
positioning an image sensor integrated circuit (IC) to be carried by the substrate within the housing, with the image sensor IC having an image sensing surface;
positioning a focus cell within the housing, aligned with the image sensing surface, with the focus cell comprising a plurality of second contacts;
positioning an electromagnetic compatibility (EMC) shield to be carried by the housing and comprising
- a top panel having an opening therein aligned with the focus cell, and
- a plurality of side panels extending downwardly from the top panel;
positioning a plurality of conductive leads, with each conductive lead extending between one of the first contacts and a corresponding one of the second contacts; and
positioning a reference conductive lead extending between the reference voltage contact and the EMC shield.

20. The method according to claim 19 wherein the reference conductive lead is configured to contact one of the plurality of side panels of the EMC shield.

21. The method according to claim 19 wherein the housing has first and second side walls, with the first side wall aligned with the first side of the substrate, with the second side wall adjacent the first side wall and having an opening extending therethrough; and wherein the reference conductive lead is exposed within the opening so as to make contact with one of the plurality of side panels of the EMC shield.

22. The method according to claim 19 wherein the reference conductive lead is configured to contact the top panel of the EMC shield.

23. The method according to claim 22 wherein the top panel of the EMC shield comprises a tab configured to make contact with the reference conductive lead.

24. The method according to claim 19 wherein an upper surface of the housing includes an opening aligned with a portion of the reference conductive lead; and further comprising placing a conductive glue within the opening so as to provide an electrical connection between the reference conductive lead and the tab of the top panel of the EMC shield.

25. The method according to claim 19 wherein the housing has first and second side walls, with the first side wall aligned with the first side of the substrate, with the second side wall adjacent the first side wall and having a housing recess; and wherein one of the plurality of side panels of the EMC shield has a tab that is received by the housing recess so as to provide a locking arrangement for retaining the EMC shield in place.

26. The method according to claim 19 further comprising forming an anti-reflective coating on an outer surface of the EMC shield.

27. The method according to claim 19 further comprising forming an adhesive layer on an inner surface of the EMC shield.

* * * * *